United States Patent [19]
Kawanami et al.

[11] Patent Number: 5,767,516
[45] Date of Patent: Jun. 16, 1998

[54] ELECTRON MICROSCOPE AND SAMPLE OBSERVING METHOD USING THE SAME

[75] Inventors: Yoshimi Kawanami, Kokubunji; Shigeyuki Hosoki, Hachioji, both of Japan

[73] Assignee: Hitachi, Ltd., Tokyo, Japan

[21] Appl. No.: 651,868

[22] Filed: May 21, 1996

[30] Foreign Application Priority Data

May 24, 1995 [JP] Japan ................. 7-124696

[51] Int. Cl.$^6$ ................. H01J 37/26
[52] U.S. Cl. ................. 250/311; 250/306
[58] Field of Search ................. 250/311, 306, 250/307, 423 F, 423 P

[56] References Cited

U.S. PATENT DOCUMENTS

| | | | |
|---|---|---|---|
| 4,618,767 | 10/1986 | Smith et al. | 250/306 |
| 4,665,313 | 5/1987 | Wells | 250/306 |
| 4,680,469 | 7/1987 | Nomura et al. | 250/306 |
| 5,278,406 | 1/1994 | Kinoshita | 250/306 |

OTHER PUBLICATIONS

"Micro–Beam Analysis", published 1985 by Asakura Syoten, pp. 181–187.

"Surface Science", vol. 126, 1983, pp. 236–244, Scanning Tunneling Microscopy Binnig et al.

"Advances in Electronics and Electron Physics", vol. 18, published by Academic Press, New York, pp. 251–255; Möllensteds et al. Electron Emmision Microscopy has No date.

*Primary Examiner*—Kiet T. Nguyen
*Attorney, Agent, or Firm*—Fay, Sharpe, Beall, Fagan, Minnich & McKee

[57] ABSTRACT

A method of observing an electric defect inside a solid sample directly by observing the situation in which conduction electrons are scattered inside the solid sample and means for realizing the method are described. A thin film electrode 2 is arranged opposite to the surface of the solid sample 1 with a minute gap, potential difference is applied between the solid sample 1 and the thin film electrode 2 by a gap voltage supply 7, conduction electrons inside he solid sample 1 are extracted outside the sample 1 by tunnel effect, and an electronic image by these extracted electrons is formed and displayed using an electronic optical system 5. By observing said electronic image, the situation of scattering of conduction electrons inside the solid sample 1 can be known and further, the information of an electric defect inside the solid sample 1 can be obtained.

9 Claims, 10 Drawing Sheets

ELECTRON MICROSCOPE AND SAMPLE OBSERVING METHOD USING THE SAME

BACKGROUND OF THE INVENTION

The present invention relates to an electron microscope used for fault analysis and inspection of electronic devices containing semiconductors or superconductors.

As the integration of semiconductor integrated circuits is accelerated and the constituent semiconductor devices are miniaturized, even very few electric defects active region of a semiconductor in an have a great effect on the characteristics of the device. Electric conduction inside the solid body of a semiconductor and others is caused by conduction electrons, that is, electrons in the vicinity of the Fermi surface (Fermi level). A conduction electron moves directly in the mean free path; however, when impurities or crystal defects exist halfway, a variety of scattering is caused in the vicinity and turbulence occurs in the direction and the density distribution of the electrons. A portion in which a local abnormality is caused in electric conduction is called an electric defect. A portion in which a large leak current is generated in a P-N junction to which a reverse bias is applied is also a kind of the above-described electric defect.

Heretofore there was no means for directly measuring the position and the scattering intensity of an electric defect having a size on the micron order. Thus, it was indirectly measured, for example with a transmission electron microscope (TEM). This TEM irradiates electrons with a large energy of approximately 100 kV on a sample, so that a crystal defect existing inside the sample can be detected by observing local crystal structures. (Refer to pp. 181 to 187 of "Micro-Beam Analysis" published in 1985 by Asakura Syoten.)

In the meantime, a scanning tunneling microscope (STM) and an emission microscope (EM) are provided as a means for observing the state of conduction electrons on the surface of a sample. The electronic state and the density distribution of the states on the surface of a sample can be observed with an STM. (Refer to pp. 236 to 244 in vol. 126 of "Surface Science" published in 1983.) The degree of electron emission from the surface of a sample, that is, the distribution of the work function on the surface of a sample can be observed with an EM. (Refer to pp. 251 to 255 in vol. 18 of "Advances in Electronics and Electron Physics" published in New York by Academic Press.)

The above-described method of indirectly measuring the position and the scattering intensity of a micron-sized electric defect inside a device by observing a crystal defect with a TEM has the following problems. First, the degree, as an electric defect, of a crystal defect observed with a TEM cannot be evaluated. Second, as a sample is required to be cut into a thin piece, a few hundred nm thick or less, to observe it with a TEM so that an electron beam irradiated on the sample can transmit the sample, the probability in which a crystal defect can be found is low. That is, it is impossible to micro-section a sample, for example a semiconductor device, so that a portion in which a crystal defect exists is included. Even if a crystal defect can be found by chance, it cannot be concluded that the crystal defect really causes an electric defect.

In the meantime, an STM and an EM are means for observing the states of conduction electrons existing on the surface of a sample, however; information of the electric conduction inside a sample cannot be obtained.

SUMMARY OF THE INVENTION

Therefore, the object of the present invention is to provide a means by which an electric defect can be directly and simply measured by observing the scattering of conduction electrons inside a solid sample.

The above-described object can be achieved by an electron microscope and a method of observing a sample with it, wherein conduction electrons inside a solid sample are emitted outside the sample after an energy level of the electrons (an energy level in a conduction band) in the sample is selected, the image of the solid sample is formed by the emitted conduction electrons and the image is observed.

An electron microscope according to the present invention can be constituted so that conduction electrons inside a solid sample are emitted outside the sample and the image of the solid sample is formed by these emitted electrons. In particular, based upon an electron microscope provided with a holding means (a holder) for holding a solid sample to be observed, an image forming means (an electronic optical system) for forming an electronic image by electrons emitted from the solid sample and a detecting means (a detector) for detecting the electronic image, an electrode arranged opposite to a portion on the surface of the solid sample from which electrons are emitted with a microscopic gap between the electrode and the portion is provided between the above-described holding means and image forming means, and a potential difference is applied between the electrode and the solid sample so as to extract electrons from the surface of the solid sample by a tunnel effect. By using a sufficiently thin, thin film electrode as the above-described electrode, the electrons extracted from the surface of the solid sample by a tunnel effect can be transmitted in the thin film electrode and can be emitted from the face of the thin film electrode reverse to the face opposite to the surface of the solid sample outside the electrode so as to form an electronic image by the electron transmitted in this thin film electrode and emitted from it. As described above, a potential difference is applied between the thin film electrode and the solid sample so that the thin film electrode is at a positive potential with respect to the solid sample.

It is desirable that a gap controlling means for controlling a gap between the above-described solid sample and the above-described electrode (thin film electrode) is provided to the above-described electron microscope and that a positioning means for changing the relative positional relationship between the solid sample and the thin film electrode in the direction parallel to the surface of the solid sample is provided to the above-described electron microscope. The above-described gap controlling means should be constituted so that the gap between both is controlled using a tunneling current or an atomic force generated between the solid sample and the thin film electrode.

A coated layer for lowering the work function of the above-described thin film electrode may be formed on the face of the thin film electrode reverse to the face opposite to the surface of the above-described solid sample. The thin film electrode may be formed so that the thin film electrode on the side of the solid sample is convex and; further, a means for feeding current in the solid sample may be provided.

A light irradiating means (a light irradiating optical system including a light source) for irradiating light on the above-described solid sample may be also provided to the above-described electron microscope to stimulate electrons in the solid sample.

It is desirable that the above-described electronic image forming means (an electronic optical system) is constituted so that it forms a magnified electronic image inside the solid sample by focusing electrons extracted from the surface of the solid sample.

A method of observing a sample according to the present invention at least comprises a step for emitting conduction electrons inside the solid sample from the surface of the solid sample, and a step for forming an electronic image inside the solid sample by the emitted conduction electrons. The above-described method of observing a sample can further include a step for detecting the formed electronic image and a step for displaying this detected electronic image.

It is desirable in the above-described step for emitting conduction electrons from the above solid sample that a conduction electron is emitted after the energy level of the conduction electron inside the solid sample is selected.

More particularly, in the above-described step for emitting conduction electrons from the above solid sample, a film electrode is arranged opposite to a portion from which a conduction electron is emitted on the surface of the solid sample with a gap between the film electrode and the solid sample and a potential difference is applied between the solid sample and the film electrode so as to cause tunneling emission of a conduction electron inside the solid sample toward the film electrode. Further, the tunneling electron is transmitted in the film electrode and emitted from the face of the film electrode reverse to the face opposite to the surface of the solid sample. Next, in the above-described step for forming an electronic image, an electronic image including the internal information of the solid sample is formed by the electron emitted from the film electrode with an electronic optical system. Further, the inside of the solid sample can be observed by detecting and displaying this electronic image.

In the above-described step for emitting conduction electrons from the above solid sample, current may be generated inside the solid sample to stimulate electrons inside the solid sample, and the solid sample may be irradiated by light. A potential difference may be applied between a coated layer and the solid sample by forming a conductive layer on the sample.

Further, after an area to be observed inside a solid sample is specified according to a method of observing a sample according to the present invention, the specified area may be observed or analyzed by another suitable method of observation or analysis.

Before the action of the present invention is described, first the behavior of conduction electrons in a solid sample will be schematically described referring to FIG. 2. An atom is constituted by a positively-charged atomic nucleus and electrons with negative electric charge, which periodically move around the atomic nucleus while being bound to nucleus by Coulomb attraction. These bound electrons are called valence electrons and are provided with different energies $\epsilon$ depending upon the positional relationship between the moving area and the atomic nucleus. Inside a solid sample which is the aggregate of such atoms, the attraction by which the atomic nucleus of each atom binds electrons is influenced by the attraction of the atomic nucleus of the adjacent atoms and weakened, and as a result, an electron moving in an area far from an atomic nucleus is released from binding by only one atomic nucleus and even moves about in the solid sample freely. Such an electron with energy $\epsilon$ that is not bound by only one atomic nucleus is called a conduction electron. However, as an atom constituting the surface of a solid sample is not adjacent to another atom at least on one side thereof, that is, on the side of the surface thereof, the force (attraction) binding an electron on the side of the surface thereof is not deteriorated. Therefore, a conduction electron cannot jump out of the solid sample.

In an atom and a solid sample constituted by atoms, the area in which a valence electron and a conduction electron exist, (that is, move about) is restrained as an electron orbit according to the energy $\epsilon$ (the so-called energy level) of each electron and only two electrons with different spin can enter each electron orbit. A valence band and a conduction band shown in the energy band diagram of FIG. 2 include each electron orbit of the valence electrons or conduction electrons of different energy levels, and in the hatched area an electron exists in any electron orbit. (The number of electron orbits at each energy level is expressed as the density of states.) The highest energy level at which a conduction electron exists in a conduction band is called the Fermi level (or Fermi surface) and expressed as $\epsilon_F$. An energy equivalent to the difference between vacuum level (the energy level of an electron not influenced by attraction from an atomic nucleus) and Fermi level, that is, the so-called work function $\Phi$ (peculiar to the material constituting the surface of a solid sample) is required so that a conduction electron jumps out of a solid sample. In fact, the density of states $D(\epsilon)$ of a conduction electron at an energy level in the vicinity of $\epsilon_F$ is provided with "a dim area" with the width of $k_B T$ ($k_B$: Boltymann's constant) with $\epsilon_F$ as the center according to the absolute temperature T of a solid sample as shown in FIG. 2. That is, as an empty electron orbit which is unoccupied by an electron exists at an energy level $\epsilon$ (plural levels sometimes exist) in this dim area, and an electron at this energy level $\epsilon$ can move about freely inside the solid sample by transferring to the above-described empty electron orbit. In other words, a conduction electron at the lower energy level $\epsilon$ than the energy level of this area, even if the electron is a conduction one, cannot move about freely inside a solid sample as long as the conduction electron is not stimulated by irradiation from outside at a high energy level because no transferable "empty electron orbit" exists at the energy level.

If an electric defect exists inside a solid sample, the force with which an atomic nucleus binds an electron locally varies at the location. If an impurity (an atom different from a main component of a solid sample) exist or a crystal defect exists, the same phenomenon also occurs. In such a case, a conduction electron which moves about freely in a solid sample is locally scattered, or is absorbed or generated excessively at the location. The present invention is made based upon a detailed examination of the above-described behavior of a conduction electron inside a solid sample.

Next, the action of the present invention will be described referring to FIGS. 2 and 3. If the surface of a film electrode is brought close to that of a solid sample via a microscopic gap, the vacuum level of both is at the same energy level and the stream of electrons from an area with a small work function to that with a large one by the tunnel effect occurs in the above-described gap. (However, it is limited to a case that an electron orbit which can accept the electrons exists in a destination of the stream.) According to the present invention, as the above solid sample is at a negative potential for the above film electrode, the vacuum level and Fermi level of the film electrode are lower than those of the solid sample as shown in the energy band diagram shown in FIG. 2.

At this time, some conduction electrons in the solid sample flow into the film electrode by the tunnel effect (tunneling). A potential barrier between the solid sample and the film electrode, shown as a gap (a rectangular potential barrier if potential difference is not applied between both), is in the shape of a wedge in the energy (energy level) area of such electrons that there is a difference between vacuum levels of both, and the smaller the thickness in the positional direction, the easier is the tunneling of the electron in the gap becomes because an energetic potential barrier is small. Electrons in this energetic area are transmitted in the electrode without entering the electron orbit of the film electrode and emitted in a vacuum.

In the meantime, an electron with lower energy than that in this area enter an "empty electron orbit" at an energy level approximately higher than Fermi level of the film electrode. In fact, as both a solid sample and a film electrode conduct via a power supply to apply a potential difference between them, the electron entering the above-described "empty electron orbit" is returned to the solid sample through a closed circuit including the above power supply. If an ampere meter is provided in this circuit, the above-described stream of electrons can be detected as a tunneling current. A conduction electron with further low electronic energy does not tunnel on the side of the film electrode because any electron orbit in a conduction band (a hatched portion) of the film electrode equivalent to the energy of the conduction electron is occupied by electrons.

As described above, according to the present invention, a conduction electron existing in a solid sample can tunnel into a film electrode by varying the potential difference between the solid sample and the film electrode, and, further, electrons with specific energy of these tunneling electrons can be selectively emitted in a vacuum. In the above description referring to FIG. 2, a film electrode is used for extracting a conduction electron from a solid sample. However, any member that has an effect of extracting (emitting) a conduction electron from a solid sample by tunneling may be used without limiting to a film electrode. However, this member is required to cover at least a portion on the surface of a solid sample from which a conduction electron is emitted (a desired portion for emitting an electron) completely, because an electron in a portion on the surface of a solid sample not covered by the above-described member remains in a conduction band of the solid sample without being emitted outside the solid sample because no destination (member) of tunneling exists.

If an electron microscope according to the present invention is used, as a conduction electron inside a solid sample is extracted at a fixed a fixed transmittance (that is, a fixed transmittance in a gap between the surface of the solid sample and a member for extracting a conduction electron thereof) by the tunnel effect without being influenced by the state of the surface of the solid sample (for example the shape or the distribution of a work function) and an electronic image is formed by the extracted conduction electron, the scattering of a conduction electron due to an electric defect inside the solid sample is displayed as an intensity distribution of electrons in this electronic image. In the conventional emission microscope, the intensity of an electron emitted from the surface of a solid sample depends upon the state of the surface (the superficial state). Therefore, an electron emitted from the sample has only information of the surface of the solid. However, in an electron microscope according to the present invention, as the information of the surface of the solid sample can be substantially erased from an emitted conduction electron by emitting a conduction electron from the solid sample by tunneling as described above, an electric defect inside the solid sample can be directly observed from an electronic image formed by this emitted electron.

The principle based upon which a conduction electron is extracted from a solid sample using a thin film electrode, (a film electrode the film of which is thin in a portion from which a conduction electron is extracted) according to a method of observing a sample specific to the present invention will be described below referring to an energy band diagram shown is FIG. 3. FIG. 3 shows an energy band for a metal solid sample and a metal thin film electrode. A valence band not related to the present invention directly is not displayed. If the gap between the solid sample and the thin film electrode is controlled so that the tunneling current or atomic force generated between both is fixed, the gap can be kept to a few nm or less. This gap can be set by controlling so that the transmittance of an electron from a solid sample to a thin film electrode is fixed. In particular, when an appropriate voltage (gap voltage) is applied between a solid sample and a thin film electrode and an electron inside the solid sample is emitted on the side of the thin film electrode by tunneling as shown in FIG. 3, an electron (B) not exceeding the vacuum level of the thin film electrode is attenuated in the thin film electrode and moves in a circuit which conducts the solid sample and the thin film electrode, for example a closed circuit including a gap voltage power supply, and the transmittance of an electron in the gap between the solid sample and the thin film electrode can be obtained based upon the monitored value by monitoring the electronic current flowing in this current as a tunneling current.

In the meantime, when a gap voltage is applied, an electron (A) exceeding the vacuum level of a thin film electrode is transmitted in the thin film electrode and emitted in the vacuum. A method of observing a sample according to the present invention is characterized by forming an image using only such a transmitted electron. However, the energy of the above-described electron (A) when it is emitted is required to be set low (that is, the accelerating energy of an electron generated by a potential difference between the solid sample and the thin film electrode is required to be set to a few eV or less) and the thickness of the thin film electrode is required to be set thin, particularly to twenty or thirty nm or less. This is because the higher the kinetic energy of an electron (A) incident to the thin film electrode from the solid sample and the thicker the thickness of the thin film electrode (film electrode), the more frequently the electron suffers inelastic scattering by another electron in the thin film electrode. As a result, the electron (A) cannot be transmitted in the thin film electrode. This reason is as follows: As an electron on another side receives high energy when an electron incident to a thin film electrode with high kinetic energy is scattered in a non-elastic form in the thin film electrode, the electron can transit to an empty electron orbit at a higher level than the Fermi level of the thin film electrode. On the contrary, if the kinetic energy of an incident electron is close to the Fermi level of the thin film electrode, an electron on another side receives energy in the vicinity of the Fermi level or less. However, in this case there is little probability in which an empty electron orbit can be found at an energy level equivalent to the received energy and, therefore, the electron on another side cannot transit to a suitable electron orbit. That is, the probability of inelastic scattering of an electron incident to a thin film electrode from a solid sample depends upon the facility of transition by energy being received by an electron on another side. As described above, it is important to set the potential difference (that is, gap voltage) between a solid sample and a thin film electrode and the thickness of the thin film electrode to appropriate values so as to realize the present invention. A conduction electron inside a solid sample can then be extracted as a free electron in the vacuum without causing disturbance.

As described above, as an electron microscope and a method of observing a sample according to the present invention are characterized by emitting a conduction electron from a solid sample by tunneling, it is essential to set a gap between the solid sample to a thin film electrode small to the extent that a tunneling current is generated. The gap voltage is required to be increased so as to let an electron (A) tunnel to a thin film electrode through a large gap. As a result the energy of the electron (A) is too high and cannot be transmitted in the thin film electrode as described above.

If the length of the gap is controlled by a tunneling current, a tunneling current of a least 1 nA ($10^{-9}$ A) is required; however, the length of a gap that can generate this tunneling current is approximately 1 nm.

An electronic current of at least 1 pA ($10^{-12}$ A) is also required for observing an electronic image. However, as the intensity of the tunneling current varies by one digit when the gap is increased by 0.1 nm (attenuation due to the increase of a gap is large), the gap between the solid sample and the thin film electrode is required to be set with an order of 0.1 nm or lower precision using a jogging mechanism utilizing a piezoelectric device.

The diameter of an area on the surface of a thin film electrode that contributes to emission of an electron from the surface of a solid sample is required to be approximately a few μm or less. This is required to avoid the following two technical problems: First, if a flat area on the surface of a solid sample is not large, the intensity of tunneling current from an area (for example, an area far from the desired portion and protruded on the side of the surface of a thin film electrode) other than a desired portion from which an electron is emitted on the surface thereof becomes dominant. Second, when an electron is extracted at fixed current density from the surface of a solid sample with large area, a thin film electrode is overheated and broken due to excessive tunneling current. In an area other than a portion on the surface of a solid sample from which a conduction electron is emitted, a reinforcing member or a supporting member for a thin film electrode may be provided; however, it is required to set a gap between either of these members and the surface of a solid sample larger than that between a thin film electrode and the surface of the solid sample and to prevent tunneling emission of an electron from the surface of the solid sample to their members. Similarly, the surface of a thin film electrode on the side of a solid sample may be convex to selectively extract an electron in the convex portion.

Finally, it will be described how an electric defect looks in an electronic image obtained by an electron microscope according to the present invention. A portion in which a conduction electron is scattered and absorbed inside a solid sample is observed as a shadow in an electronic image. However, an electric defect in a place deeper than the mean free path of a conduction electron inside a solid sample from the surface thereof is not displayed so clearly in an electronic image because, for example, an electron which should not be emitted from the surface of a solid sample is emitted (a conduction electron suffers scattering due to an unspecified cause other than an electric defect) by a conduction electron scattered due to the electric defect further being scattered by another electron inside the solid sample. When current is applied from the side of a solid sample (an electronic current is generated in the solid sample) and an electron with high energy obtained by lowering the gap voltage is selectively emitted, only a scattered portion of electrons forming the above-described electronic current is observed as a bright point. If a solid sample is irradiated by light, only a portion in which irradiated light is absorbed and from which an electron is emitted is observed as a bright point. The resolution of an image obtained with the above-described electron microscope depends upon the aberration of the electron optical system and the resolution of the electronic image detection system. If the density of electric defects inside the solid sample is low enough, individual electric defects can be observed by separating them.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Figure 1:
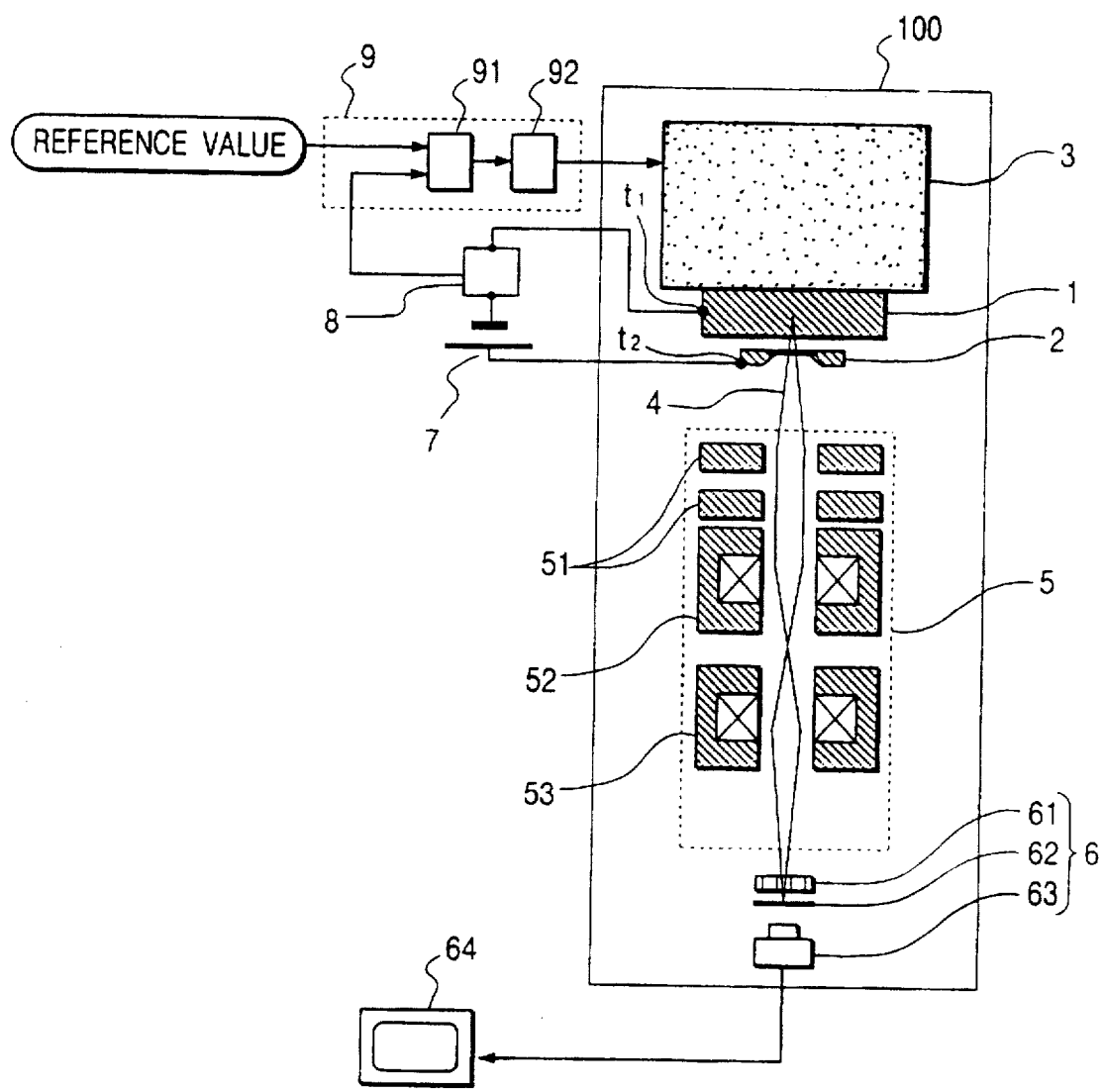
FIG. 1 is a schematic block diagram showing an electron microscope according to a first embodiment of the present invention.
Figure 2:
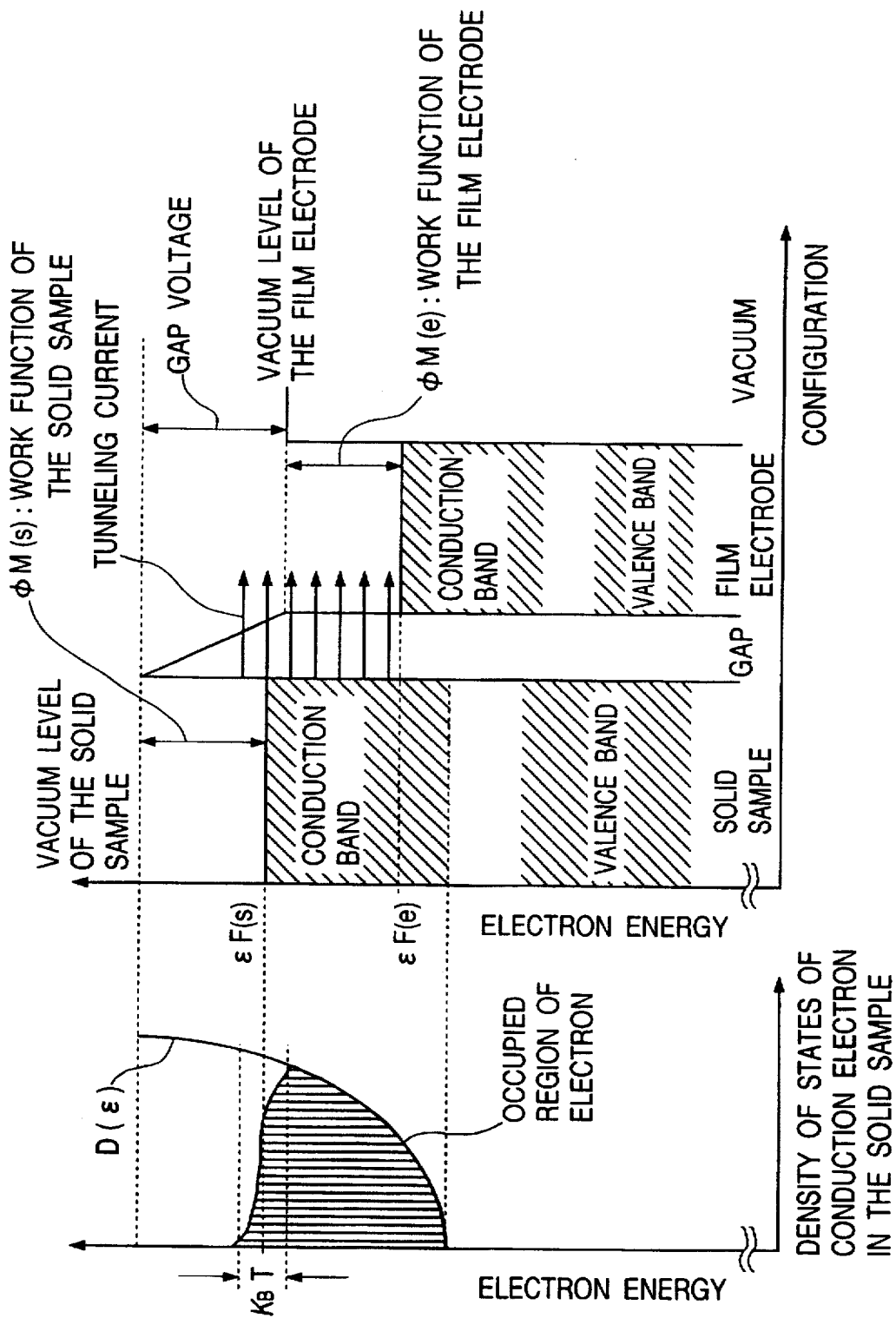
FIG. 2 shows the density of states of a conduction electron inside a solid and an energy band for explaining the principle of the present invention.

The embodiments according to the present invention will be described in detail referring to the drawings below.

FIRST EMBODIMENT

FIG. 1 shows the schematic constitution of an electron microscope (a conduction electron microscope) according to a first embodiment of the present invention. The body of a conduction electron microscope according to the present invention is constituted by a solid sample 1, a thin film electrode 2, a gap driving mechanism 3 for controlling a gap between the solid sample 1 and the thin film electrode 2, an electronic optical system 5 for focusing electrons 4 extracted from the solid sample 1 and transmitted in the thin film electrode 2, an electronic image detector 6 for detecting an electronic image formed by the focused electrons 4, and a sample jogging mechanism (not shown) for minutely moving the solid sample 1 two-dimensionally in a plane perpendicular to the optical axis of the apparatus. These components are arranged in a vacuum chamber 100 and supported respectively by a predetermined support (not shown). (It is desirable that these supports are provided with a suitable vibration isolating mechanism.)

Figure 4:
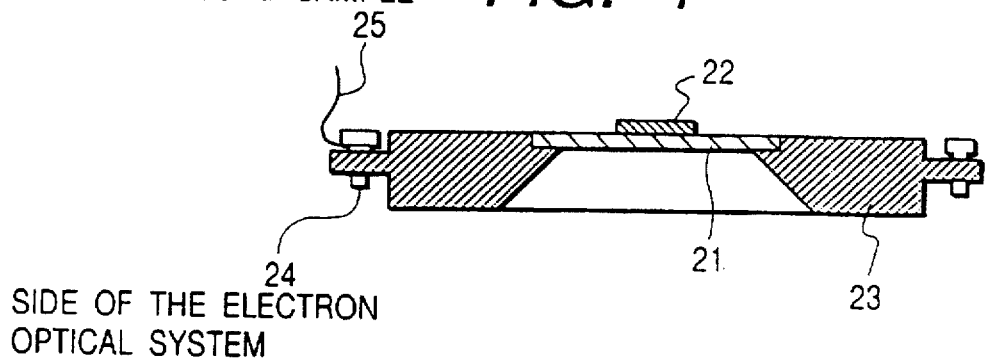
FIG. 4 is a schematic block diagram showing a thin film electrode in a first embodiment of the present invention.

The solid sample 1 is constituted by conductive material and at least the surface thereof on the side opposite to the thin film electrode 2 is flattened by polishing or by another method. The thin film electrode 2 is fabricated by forming a thin film of gold single crystal 22 approximately 10 nm thick on a micro grid 21 as schematically shown in FIG. 4 and by trimming this film of gold by a focused ion beam so that an area approximately 5 μm in diameter is left. This thin film electrode 2 is fixed on a conductive supporting base 23 and a lead wire 25 insulated from grounding potential for applying voltage to the thin film electrode 2 is connected to a bolt 24 used for fixing the supporting base 23 in the vacuum chamber 100. The thin film electrode 2 is be cooled by a liquid nitrogen recirculating cooling head (not shown).

As shown in FIG. 1, the gap driving mechanism 3 consists of a jogging mechanism using a piezoelectric device that can jog in three dimensions (x, y, z) in a rectangular coordinate system with a resolution of approximately 0.001 nm. The electronic optical system 5 is provided with one stage of electrostatic lens 51 for acceleration and two stages of electromagnetic lenses 52 and 53, and can accelerate electrons 4 to 5 keV and focus them with an enlargement ratio of approximately 1000. The aberration of this electronic optical system 5 is approximately 10 μm (approximately 10 nm if converted on the side of the solid sample 1).

In the meantime, the electronic image detector 6 is constituted by a micro channel plate 61 with the diameter of a hole of approximately 10 μm, and a fluorescent screen 62. The micro channel plate 61 reflects a clear electronic image on the fluorescent screen 62 by multiplying the number of electrons 4. An electronic image reflected on the fluorescent screen 62 is photographed by a video camera 63 and displayed on CRT 64, whereby, an electronic image can be directly observed . If the electronic image is photographed, a photographic dry plate is arranged in place of the video camera 63.

In the meantime, in an electron microscope according to this embodiment, as shown in FIG. 1, a gap voltage supply 7 and a current amplifier 8 are connected between the solid sample 1 and the thin film electrode 2. An electric field with predetermined intensity can be generated in vacuum space (a so-called gap or clearance) between the solid sample 1 and the thin film electrode 2 by the gap voltage supply 7, by connecting the solid sample 1 and the thin film electrode 2 via this gap voltage supply 7. In this embodiment, the negative terminal $t_1$ of an electric field generating circuit including the gap voltage supply 7 is connected to the solid sample 1 and the positive terminal $t_2$ is connected to the thin film electrode 2. Samples can be readily exchanged when plural samples are observed because the negative terminal $t_1$ is designed so that it can be readily attached or detached to/from the solid sample 1.

The solid sample 1 and the thin film electrode 2 are insulated from the vacuum chamber 100. The solid sample 1 is held on the gap driving mechanism 3 via an insulating member not shown. If the gap driving mechanism 3 constituted by a conductor including a sample holder is used, the gap driving mechanism 3 and the vacuum chamber 100 may be insulated. Even if the solid sample 1 and the vacuum chamber 100 are at the same potential without insulating the solid sample from the vacuum chamber, observation is enabled.

A gap controlling circuit 9 is constituted by a differentiating circuit 91 and a driving circuit 92. The differentiating circuit 91 sends the difference between a current value detected by a current detecting circuit 8 and a reference value to the driving circuit 92, and the driving circuit 92 drives the gap driving mechanism 3 based upon this difference. When the solid sample 1 is brought close to the thin film electrode 2 by the gap driving mechanism 3, an electron tunnels between the opposite faces of both and a tunneling current flows. The gap controlling circuit 9 drives the gap driving mechanism 3 so that this tunneling current detected by the current detecting circuit 8 is equal to a set value (approximately 1 nA in this case) and fixed. As a result, a gap between the solid sample 1 and the thin film electrode 2 is controlled so that it is a fixed value of approximately 1 nm. An inclination driving mechanism (not shown) constituted by a piezoelectric device for changing the inclination of the solid sample 1 is provided behind the gap driving mechanism 3 so as to adjust the degree of parallelization between the surface of the solid sample 1 and that of the thin film electrode 2. The degree of parallelization is in fact adjusted by inclining the solid sample 1 so that the electron current transmitted in the thin film electrode 2 is maximum.

This embodiment is characterized by extracting a conduction electron inside the solid sample 1 as a free electron 4 in vacuum space by bringing the solid sample 1 and the thin film electrode 2 close, controlling the gap by the tunneling current flowing between both. These electrons 4 are focused, magnified and formed as an electronic image by the electronic optical system 5 and the situation of scattering of conduction electrons inside the solid sample 1 can be observed based upon this electronic image. The method and the principle for extracting an electron 4 from the solid sample 1 using the thin film electrode 2 are described above in detail.

In this embodiment, the gap voltage is set so that the kinetic energy of an electron 4 immediately after it is extracted from the solid sample 1 is 1 eV or less. As an electron with this degree of kinetic energy has the mean free path of inelastic scattering of approximately 5 nm or more in the thin film of gold single crystal constituting the thin film electrode 2, it can be transmitted with little scattering in the thin film electrode according to this embodiment (a thin film of gold single crystal approximately 10 nm thick). Further, thermal scattering of an electron inside the thin film electrode 2 is prevented by cooling the thin film electrode 2.

When a semiconductor sample is observed with a conduction electron microscope equivalent to this embodiment, an electronic scatterer presumable due to ionized impurities and an electronic absorber presumable due to a deposit emerge as a shadow in an electronic image. When the drain of a faulty transistor is observed biasing, emission of a conduction electron from a portion in which leakage current is generated is observed as a clear point. The depth of a portion in which the electronic scatterer, the electronic absorber and an electronic emitter exist (a portion with an electric defect) from the surface of the sample can be also known by focusing the electronic optical system 5 on them. The resolution of this electronic image is approximately 20 nm if it is calculated based upon the performance of the electronic optical system 5 and the electronic image detector 6.

As described above, according to this embodiment, the scatterer of a conduction electron existing inside a conductive solid sample can be observed at high resolution of approximately 20 nm. In this embodiment, the gap driving mechanism 3 is attached on the side of the solid sample 1. However, the same effect can be also obtained if the mechanism is attached on the side of the thin film electrode 2. In this embodiment, the thin film electrode 2 is cooled. However, if the solid sample 1 is cooled, thermal scattering of a conduction electron inside the solid sample 1 is prevented and noise in an electronic image formed by the electronic optical system 5 is reduced. Chromatic aberration is reduced and the resolution of an electronic image can be also enhanced by providing an energy filter for an electron 4 inside the electronic optical system 5 according to this embodiment.

SECOND EMBODIMENT

Figure 5:
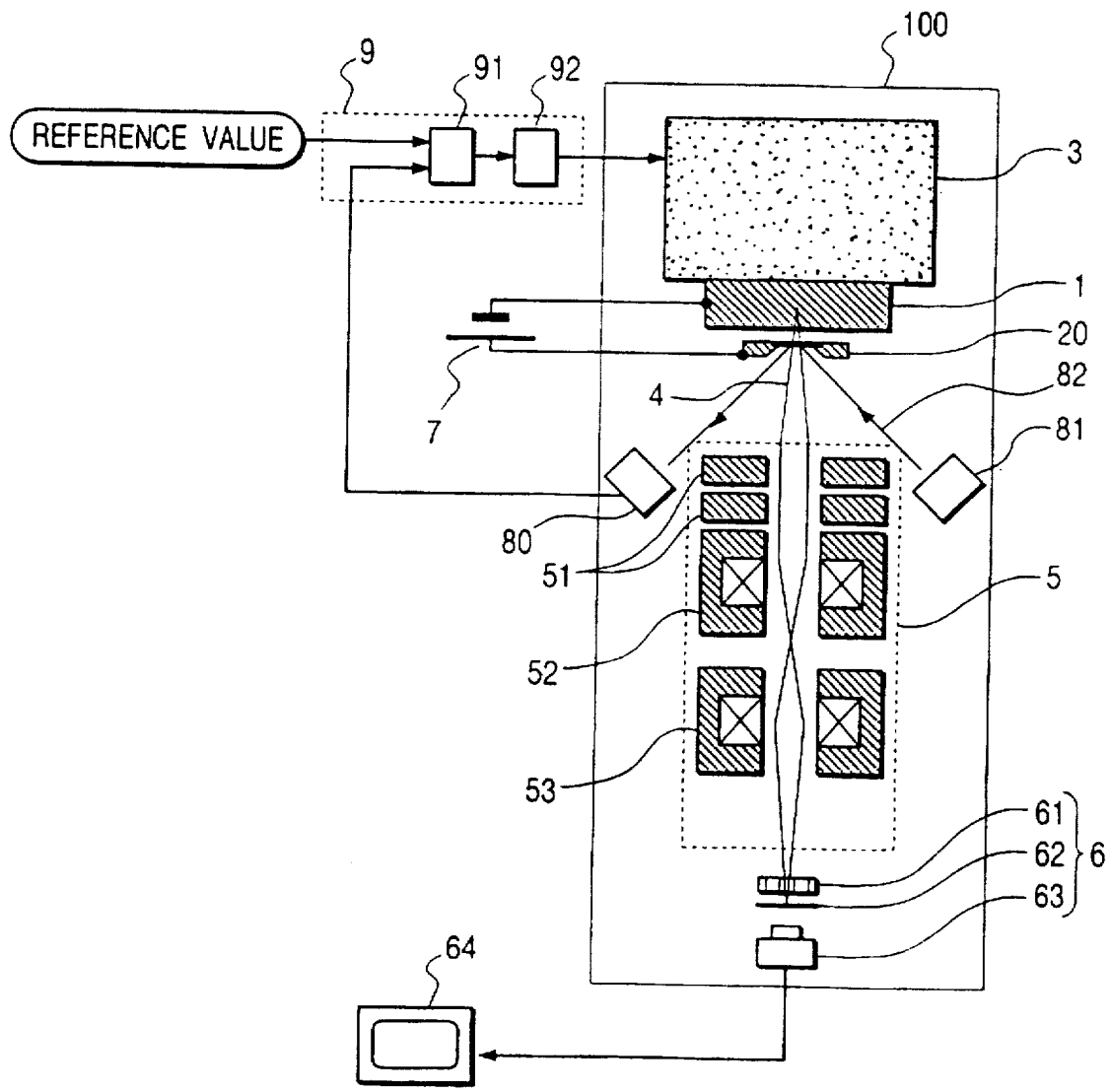
FIG. 5 is a schematic block diagram showing an electron microscope according to a second embodiment of the present invention.

FIG. 5 is a schematic block diagram showing an electron microscope (a conduction electron microscope) according to a second embodiment of the present invention. A conduction electron microscope according to this embodiment is constituted by approximately the same components as those of the conduction electron microscope of the first embodiment shown in FIG. 1. The first and second embodiments are basically different in that in this embodiment, a gap between the solid sample 1 and a thin film electrode 20 is controlled by detecting the atomic force (repulsive force) generated between them in place of the tunneling current in the first embodiment. That is, in this embodiment, the thin film electrode 20 is supported by a cantilever (not shown) and displaced in proportion to the force (the atomic force) which operates on the thin film electrode 20. A displacement detector 80 measures the amount of displacement of the thin film electrode 20 by detecting a laser beam 82 emitted from a laser beam source 81 and reflected by the thin film electrode 20. The displacement detector 80 sends an output signal corresponding to the amount of measured displacement (that is, the force applied to the thin film electrode) to the gap controlling circuit 9. The gap controlling circuit 9 drives the gap driving mechanism 3 so that this output signal is equal to a set value and fixed. As a result, the gap between the solid sample 1 and the thin film electrode 20 is controlled so that it is approximately 1 nm.

This embodiment is characterized by extracting conduction electrons inside the solid sample 1 as free electrons 4 in vacuum space by bringing the solid sample 1 and the thin film electrode 20 close, controlling the gap by the atomic force operating between both. The method and the principle of extracting an electron 4 from the solid sample 1 using the thin film electrode 2 is described above in detail. The situation of scattering of a conduction electron inside the solid sample 1 can be known by observing an electronic image obtained by focusing electrons 4 extracted from this solid sample 1 and forming an image based upon it by the electronic optical system 5. In this embodiment, as a tunneling current is not used for controlling the gap as in the first embodiment, the gap can be controlled appropriately even if the surface of the solid sample 1 is partly an insulator.

As a gap between the thin film electrode and the sample can be appropriately controlled even if a part of the surface of the solid sample is an insulator according to this embodiment, the scattering of a conduction electron inside an insulated solid sample can be also stably observed.

THIRD EMBODIMENT

A third embodiment according to the present invention will be described referring to FIG. 6. In the thin film electrode of the electron microscope described in the first and second embodiments, as the energy of an electron approaches the Fermi surface, the penetrability of the electron in the thin film electrode is enhanced because the mean free path of inelastic scattering is extended. In this embodiment, the penetrability of an electron in the thin film electrode is enhanced by coating the surface of the thin film electrode reverse to the solid sample with material having a low work function, so that the work function thereof (the difference in energy between the Fermi surface and a vacuum level) is effectively lowered. In particular, after barium is deposited by one monolayer on the surface of a gold thin film electrode a few nm thick reverse to the solid sample, it is oxidized and a coated layer consisting of barium oxide is formed.

Figure 3:
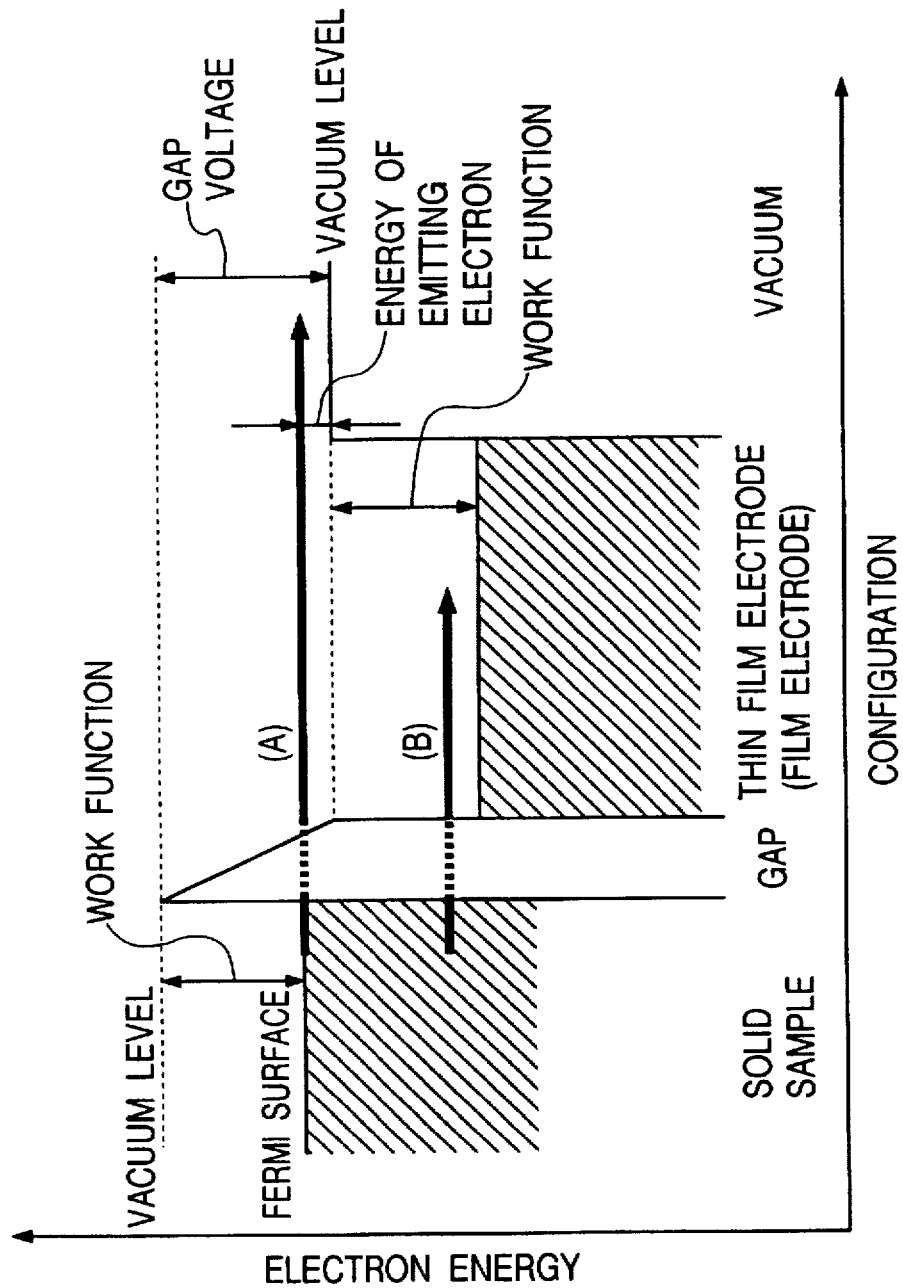
FIG. 3 is an energy band diagram for explaining the operation according to the present invention.
Figure 6:
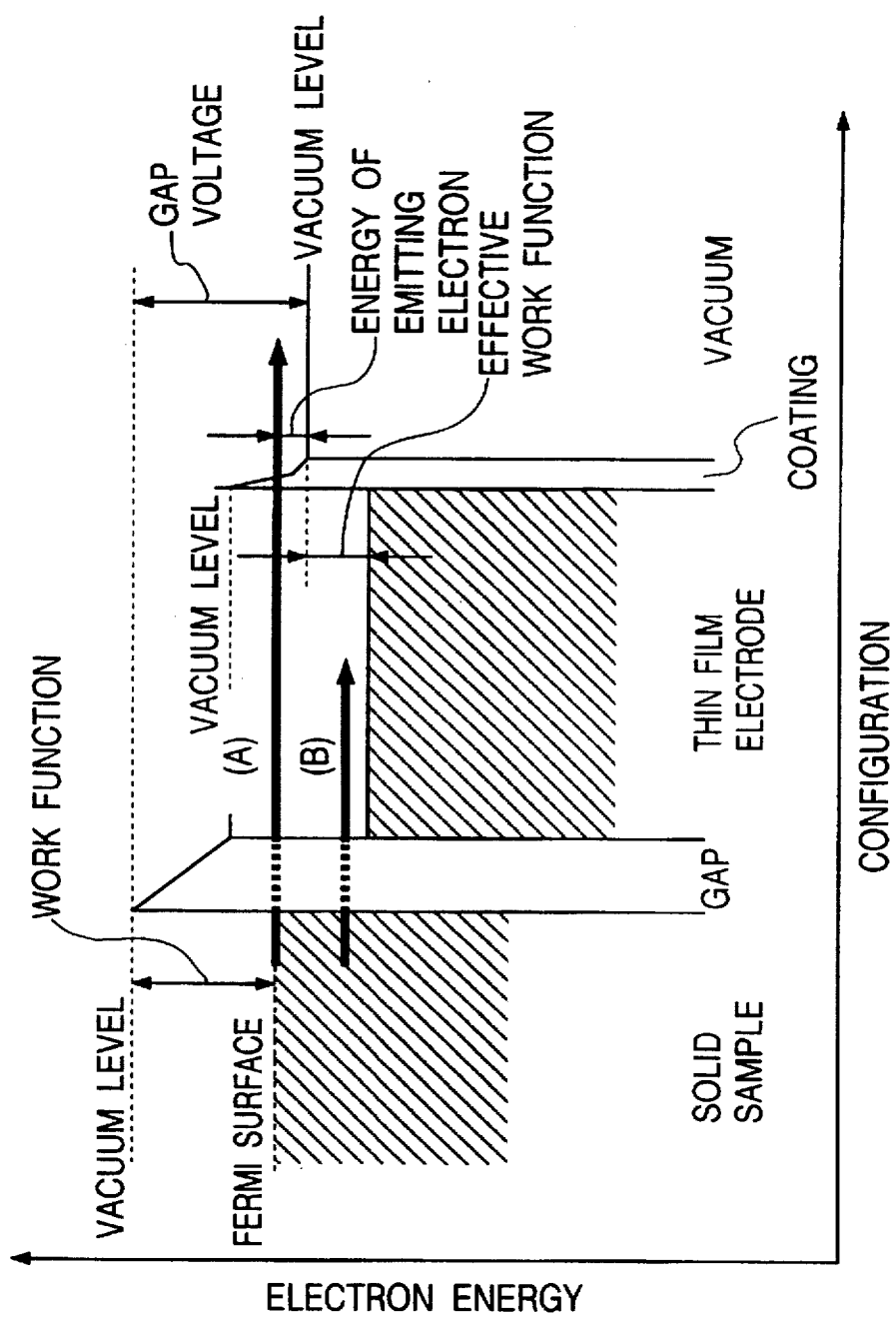
FIG. 6 is an energy band diagram for explaining the operational principle of a third embodiment of the present invention.

FIG. 6 shows the situation in which an electron is extracted in such a state. FIG. 6 shows a case in which the solid sample is made of metal. An electron (A) emitted in a vacuum in this embodiment has an energy level closer to the Fermi surface in the thin film electrode, compared with the case shown in FIG. 3 wherein the thin film electrode is not coated and the penetrability is enhanced a few times. As the above-described coated layer is very thin, scattering of an electron inside may be ignored. As a result of forming the coated layer, the ratio of the amount of electron current emitted in vacuum space after being transmitted in the thin film electrode to the amount of tunneling current emitted from the solid sample is increased.

As the penetrability of an electron in the thin film electrode is high according to this embodiment, the thin film electrode can be thickened to strengthen it. For coating material which can effectively lower the work function of the thin film electrode, barium, zirconium, cesium, titanium and their oxide films are proposed. After the thin film electrode is coated as described above, the other surface of the thin film electrode and the surface of the sample may be further coated.

FOURTH EMBODIMENT

A fourth embodiment according to the present invention will be described below referring to FIG. 7. The thin film electrode in the conduction electron microscope described in the first and second embodiments is constituted so that it is approximately flat as shown in FIG. 4 and a thin film of metallic single crystal is formed by trimming by a focused ion beam (FIB) to limit an area in which a conduction electron tunnels. In this embodiment, the area in which a conduction electron tunnels is limited by forming the thin film electrode so that it is convex on the side of the solid sample instead.

Figure 7:
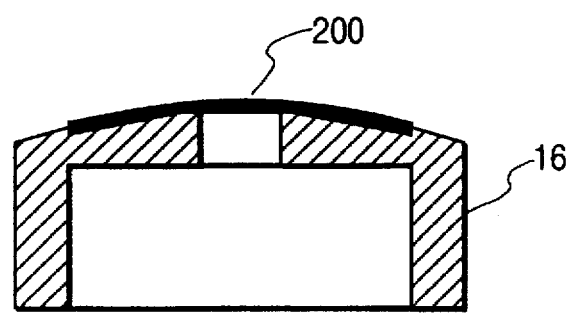
FIG. 7 is a schematic block diagram showing a thin film electrode in a fourth embodiment of the present invention.

In particular, a thin film electrode in a sectional shape shown in FIG. 7 is used. The upper face of a backup ring 16 has a spherical shape with a radius of curvature of 20 mm and is provided with a through hole 0.5 mm in diameter in the center thereof. A gold thin film electrode 200 approximately 10 nm thick is stuck on the upper face of the backup ring 16 with an adhesive made of epoxy resin. Hereby, the thin film electrode 200 is provided with a spherical shape with the radius of curvature of approximately 20 mm which is convex on the side of the solid sample.

When the gap between the thin film electrode and the solid sample is widened by 0.1 nm, the intensity of tunneling of a conduction electron is reduced by approximately one digit. Therefore, an area in which a conduction electron tunnels is effectively limited to only the summit with the radius of approximately 2 μm in the thin film electrode with the above-described curvature. As the condition of tunneling is almost unchanged in the thin film electrode with such curvature even if the thin film electrode is tilted a little to the surface of the solid sample, no mechanism for adjusting the degree of parallelization between both is required.

As no mechanism for adjusting the tilt of the thin film electrode is required according to this embodiment, the apparatus is simplified. In this embodiment, curvature is applied to the overall thin film electrode. However, the same effect can be also obtained if partial curvature is applied to only a required part of the thin film electrode.

FIFTH EMBODIMENT

A fifth embodiment according to the present invention will be described below referring to FIG. 8. As a portion in which a conduction electron is scattered in a sample emerges as a shadow in an obtained electronic image according to a normal method of observing a sample with an electron microscope (a conduction electron microscope) described in the first embodiment, there is a case that it is difficult to distinguish whether it is a shadow or not. In this embodiment, this situation is improved and a method which enables sensitive observation will be described below.

Figure 8:
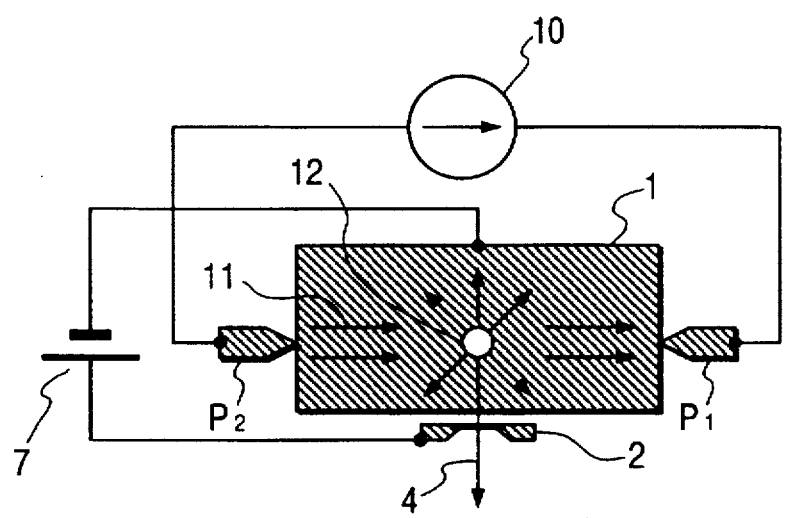
FIG. 8 is an explanatory drawing of a method of observing a sample according to a fifth embodiment of the present invention.

FIG. 8 shows only a solid sample 1 and a thin film electrode 2 in a conduction electron microscope equivalent to this embodiment. First, two point contacts $P_1$ and $P_2$ are attached on the side of the solid sample 1 and current is allowed to flow in the horizontal direction of the solid sample 1 (in the direction parallel to the surface opposite to the thin film electrode 2) by a constant current source 10. Whereby, a conduction electron 11 with a little higher energy in the direction reverse to current inside the solid sample 1 is generated. Next, a setting is made so that the gap voltage applied between the solid sample 1 and the thin film electrode 2 by a gap voltage supply 7 is reduced a little compared to normal and only a conduction electron with a little higher energy than normally is emitted in a vacuum. By the above-described method, only a conduction electron which is scattered by a scatterer 12 and directed in the direction of the surface of the sample of conduction electrons 11 is transmitted in the thin film electrode 2 and extracted in a vacuum as an electron 4. Only a portion in which a conduction electron is scattered inside the solid sample 1 is displayed more clearly than the other portion, that is, by contrast reverse to the normal one in an electronic image formed by electrons 4 extracted as described above.

According to this embodiment, a portion in which a conduction electron is scattered inside the solid sample can be observed sensitively. If a solid sample with magnetoresistance is observed by a method according to this embodiment, a portion in which the scatterer of a conduction electron which causes magnetoresistance exists can be observed sensitively if electronic images obtained when a magnetic field is applied to the sample and when not are compared.

SIXTH EMBODIMENT

A sixth embodiment according to the present invention will be described below referring to FIG. 9. If a semiconductor whose band is bending due to surface states is a sample, it is difficult to observe the inside of the sample because a conduction electron cannot reach the surface of the sample by a normal method of observing with the electron microscope (the conduction electron microscope) described in the first embodiment. In this embodiment, a method of observing such a semiconductor sample will be described.

Figure 9:
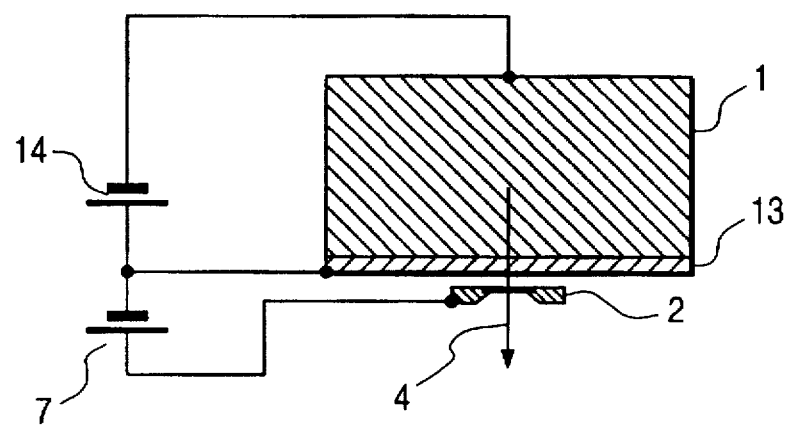
FIG. 9 is an explanatory drawing of a method of observing a sample according to a sixth embodiment of the present invention.

FIG. 9 shows only a solid sample 1 and a thin film electrode 2 in a conduction electron microscope according to this embodiment. First, a thin metallic coating layer approximately 1 nm thick 13 is formed on the surface of the semiconductor sample 1 consisting of a semiconductor. Next, voltage is applied between the solid sample 1 and the metallic coating layer 13 by a voltage supply 14 to flatten a band in the semiconductor layer 1. Thus, as a conduction electron inside the semiconductor layer 1 reaches the surface of the sample, it can be extracted using the thin film electrode 2.

Figure 10:
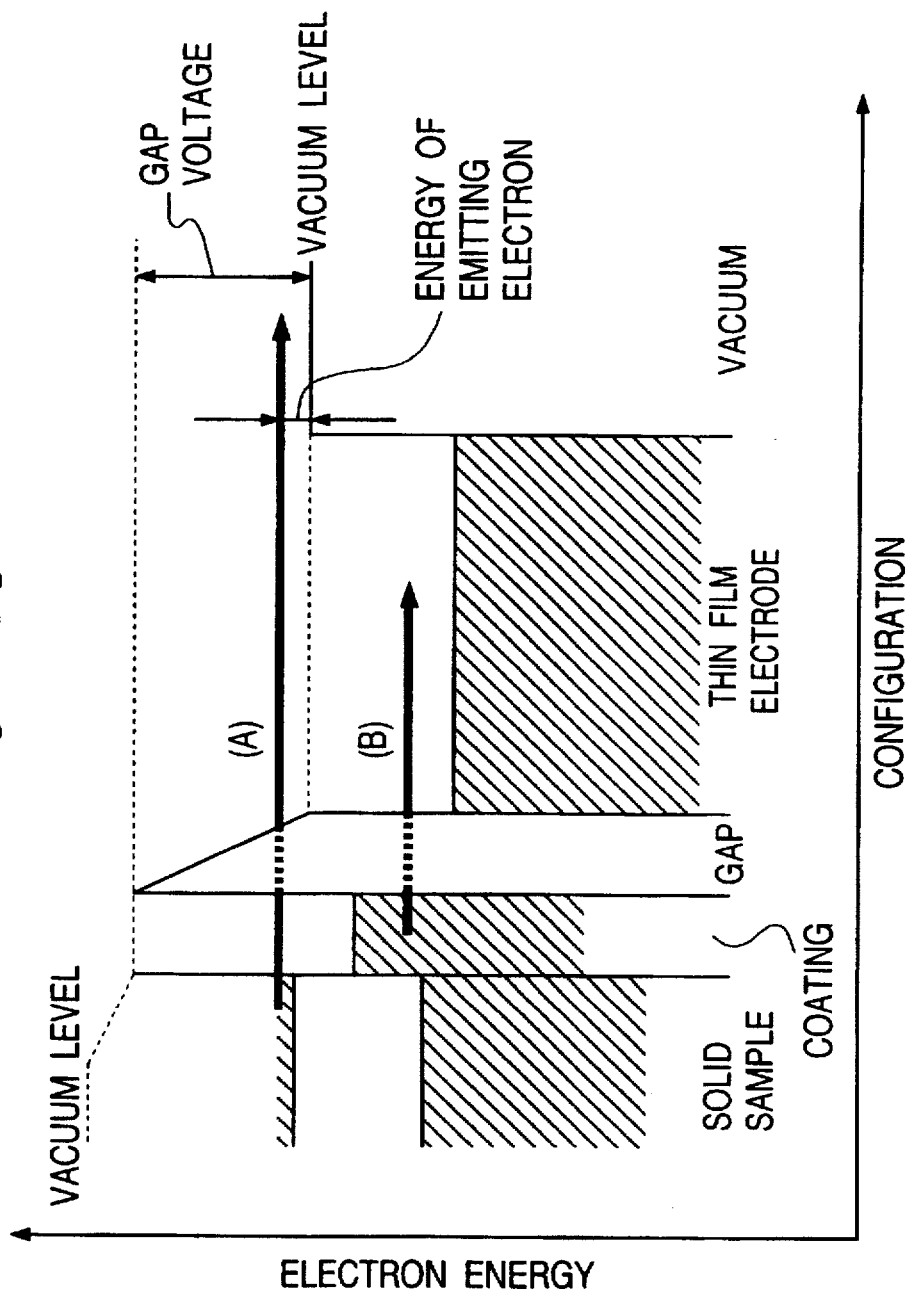
FIG. 10 is an energy band diagram for explaining the operational principle of the sixth embodiment of the present invention.

This situation will be described below referring to the energy band diagram shown in FIG. 10. As a result of applying voltage between the semiconductor layer (solid sample) 1 and the metallic coating layer 13, an electric field is generated on the interface of the semiconductor layer (a portion in which a vacuum level is displayed so that it is bending) and the band is flattened. A conduction electron inside the semiconductor layer flows into the metallic layer on the surface thereof by this electric field and current is generated. If the thin film electrode 2 is brought close to the metallic layer with a suitable potential difference, some (A) of the conduction electrons inside the semiconductor layer 1 are transmitted in the metallic layer 13 and tunnel on the side of the thin film electrode 2, and an electron (B) in the metallic layer 13 also tunnels on the side of the thin film electrode 2. As the energy level of the electrons (A) is higher than the vacuum level of the thin film electrode 2, they are transmitted in the thin film electrode 2 and emitted in a vacuum.

In the meantime, as the energy level of the electron (B) is lower than the vacuum level of the thin film electrode 2, it is attenuated in the thin film electrode 2 to be a tunneling current. By the above-described method, a conduction electron inside the semiconductor sample 1 is transmitted in the thin film electrode 2 and extracted in a vacuum as an electron 4. The situation of scattering of a conduction electron inside the semiconductor sample 1 can be observed owing to an electronic image formed by this electron 4.

According to this embodiment, the state of scattering of a conduction electron inside a sample which cannot be observed by the conventional method or the method described in the first embodiment, for example a semiconductor material, can be observed.

SEVENTH EMBODIMENT

A seventh embodiment according to the present invention will be described below referring to FIG. 11. If a semi-insulator semiconductor is a sample, the inside of the sample cannot be observed by a normal method of observing a sample with the conduction electron microscope described in the first and second embodiments because there are only a few conduction electrons inside the semiconductor sample. In this embodiment, a method of observing the inside of such a semiconductor sample will be described.

Figure 11:
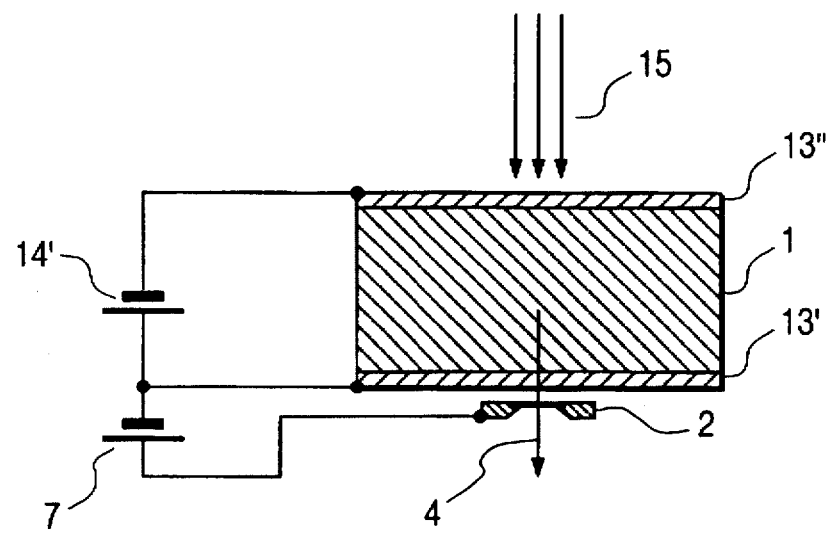
FIG. 11 is an explanatory drawing of a method of observing a sample according to a seventh embodiment of the present invention.

FIG. 11 shows only a solid sample 1 and a thin film electrode 2 in a conduction electron microscope according to this embodiment. First, a thin metallic coating layer 1 nm or less thick 13' is formed on the surface of the semiconductor sample 1 to apply a gap voltage. A thin metallic coating layer 1 nm or less thick 13" is also formed on the rear face of the sample 1. The latter metallic coating layer 13" is provided for forming a weak electric field inside the sample 1 by a voltage supply 14.

Next, monochromatic light 15 with energy larger than a band gap inside the semiconductor sample is irradiated from the side of the rear face of the sample 1. As the coating layer is thin, the monochromatic light 15 enters the inside of the semiconductor sample 1 and is absorbed there. A pair of an electron and a hole are generated inside the semiconductor sample 1 by this absorption of light. However, this electron and this hole are separated by the weak electric field formed by the above-described voltage supply 14' and as the electron drifts as a conduction electron in the direction of the surface of the sample 1, it is extracted out of the sample using the thin film electrode 2.

By the above-described method, a conduction electron generated inside the semiconductor sample 1 is transmitted in the thin film electrode 2 and extracted in a vacuum as an electron 4. The situation of scattering of a conduction electron inside the semiconductor sample 1 can be observed owing to an electronic image formed by this electron 4.

Figure 12:
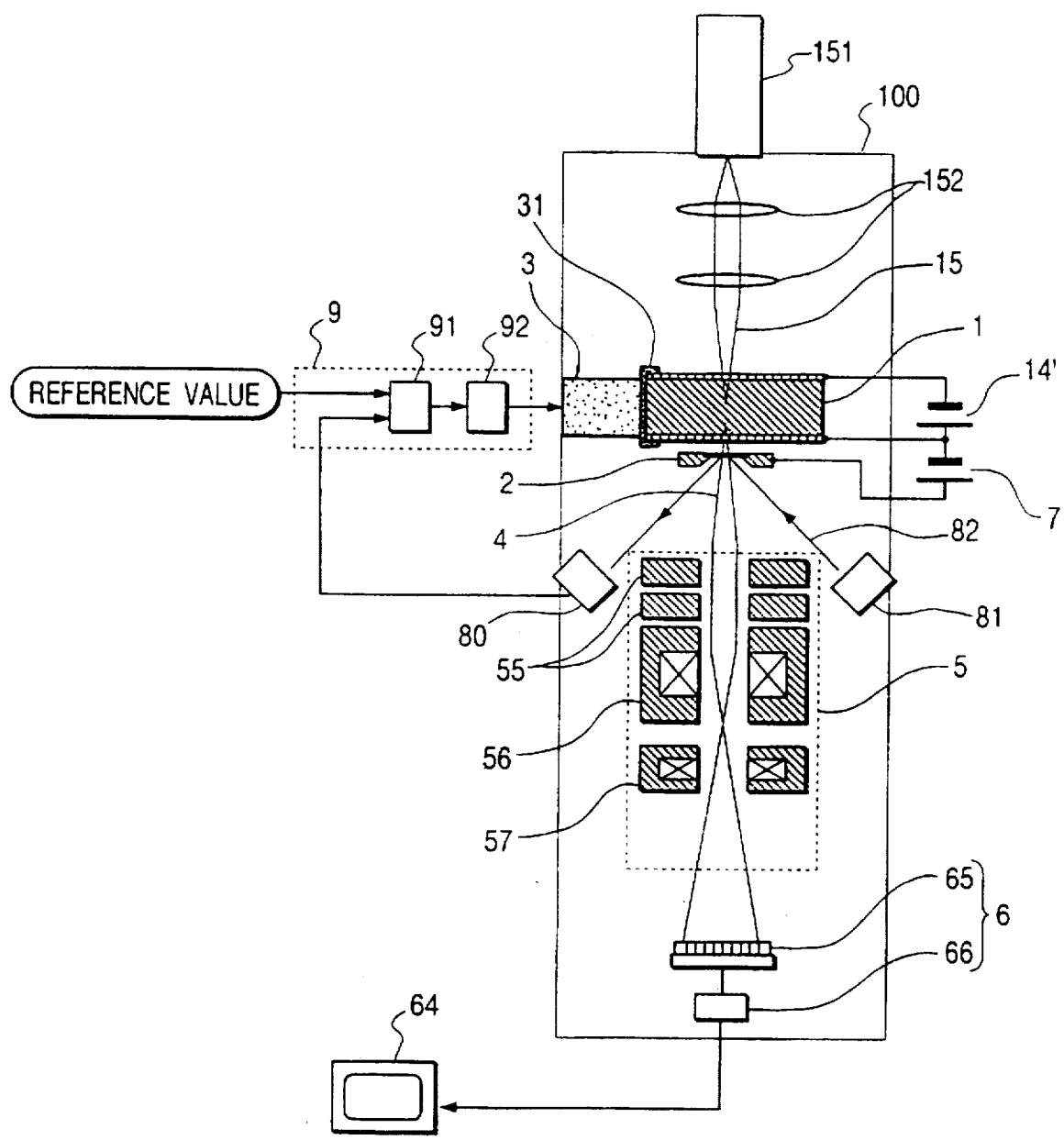
FIG. 12 is a schematic block diagram showing an electron microscope according to the seventh embodiment of the present invention.

FIG. 12 shows an example of the constitution of an electron microscope suitable for observation of a sample according to this embodiment. The basic constitution is close to that described in the second embodiment (see FIG. 5.). However, this embodiment is characterized in that a light source 151 of monochromatic light (a beam) 15 for irradiating the solid sample 1 on the upper and lower surfaces of which a coating layer shown in FIG. 11 is provided, and an optical system 152 for focusing this beam 15 and irradiating the upper face of the solid sample 1 are arranged in the upper part of a vacuum chamber 100.

As the optical path of light irradiated by a light applying means consisting of this light source 151 and the optical system 152 is in a vacuum, not only visible light and infrared light but light with a wavelength readily absorbed in the air, such as vacuum ultraviolet rays, can be used as irradiated light (monochromatic light). The light source 151 should be so constituted that the area of an emitted wavelength thereof can be varied depending upon the material of the solid sample to be observed, for example by replacing light sources, and an optical filter for limiting the area of a transmitted wavelength to prevent light with an undesirable wavelength from being applied to the solid sample 1 may be provided to the above-described light applying means.

In this embodiment, the side of the solid sample 1 is held by a gap driving mechanism 3 to facilitate irradiating the upper face of the solid sample 1. In this case, a potential difference can be applied between the upper and lower faces of the solid sample 1 by the voltage supply 14' by holding the solid sample 1 via an insulating jig 31.

In a conduction electron microscope shown in FIG. 12, an electron (an electron beam) 4 emitted from the lower face of the solid sample 1 is imaged on the surface of a multichannel plate 65 by an electronic optical system 5 consisting of an electrostatic lens 55 and electromagnetic lenses 56 and 57. Multiple minute electron detecting devices are arrayed two-dimensionally on the surface of the multichannel plate 65 (not shown), a detection signal is sent to an amplifier 66 of every electron detecting device, and an enlarged electronic image inside the solid sample 1 is displayed on the display screen of CRT (a display) 64 based upon these detection signals (a signal detected by each electron detection device is equivalent to a pixel of an electronic image on the display screen).

According to this embodiment, the inside of a partially insulated semiconductor sample, which cannot be observed with the conduction electron microscope described in the first and second embodiments, can be also observed. Irradiation of a semiconductor sample described in this embodiment can be also utilized to generate an electron from only a certain defect level in a semiconductor and to observe only these defects sensitively by suitably selecting the energy of the irradiating light. In this case, the gap voltage is reduced, compared with that in a normal method of observing a sample so as to catch only electrons generated from the above-described defect level. If the conductivity of a sample is high, formation of the above-described coating layer may be omitted.

EIGHTH EMBODIMENT

An eighth embodiment according to the present invention will be described below referring to FIG. 13. A method of positioning a sample area to be observed with the conduction electron microscope described in the first embodiment and analyzing this by another means will be described below. In this embodiment, an electric defect is detected with such a conduction electron microscope, the sample is sectioned minutely by a focused ion beam so that such a microsection includes this electric defect and finally this electric defect is analyzed with a TEM.

A pattern in which a metal and a semiconductor are combined is provided on the surface of a solid sample as a positioning mark beforehand. The surface of the solid sample is flattened by polishing or others.

First, an electronic image on the surface of a solid sample and an electronic image of a portion including an electric defect in the same view inside the solid sample are photographed with a conduction electron microscope according to the present invention, and their images are stored. Next, a suitable threshold is set to the above-described electronic image on the surface of the solid sample to perform a binary operation. As the electron current transmitted in a thin film electrode and emitted in case the surface of a solid sample is a semiconductor is sometimes as large as the electron current for the surface of a solid metal sample is metal, the position of the positioning mark can be readily detected based upon the above-described electronic images to which the binary operation is applied. The two-dimensional position of an electric defect is read based upon the position of the positioning mark by comparing the above-described electronic image on the surface of the solid sample and the above-described electronic image inside the solid sample. The depth of an electronic defect inside the solid sample is read based upon the focal length of an electronic optical system. The solid sample is sectioned minutely by a focused ion beam (FIB) so that the microsection includes the center of the above-described electric defect based upon the positional data of the electric defect obtained by the above-described method. The center of this sectioned sample is observed with a transmission electron microscope (TEM) to analyze the structure of the above-described electric defect.

Figure 13:
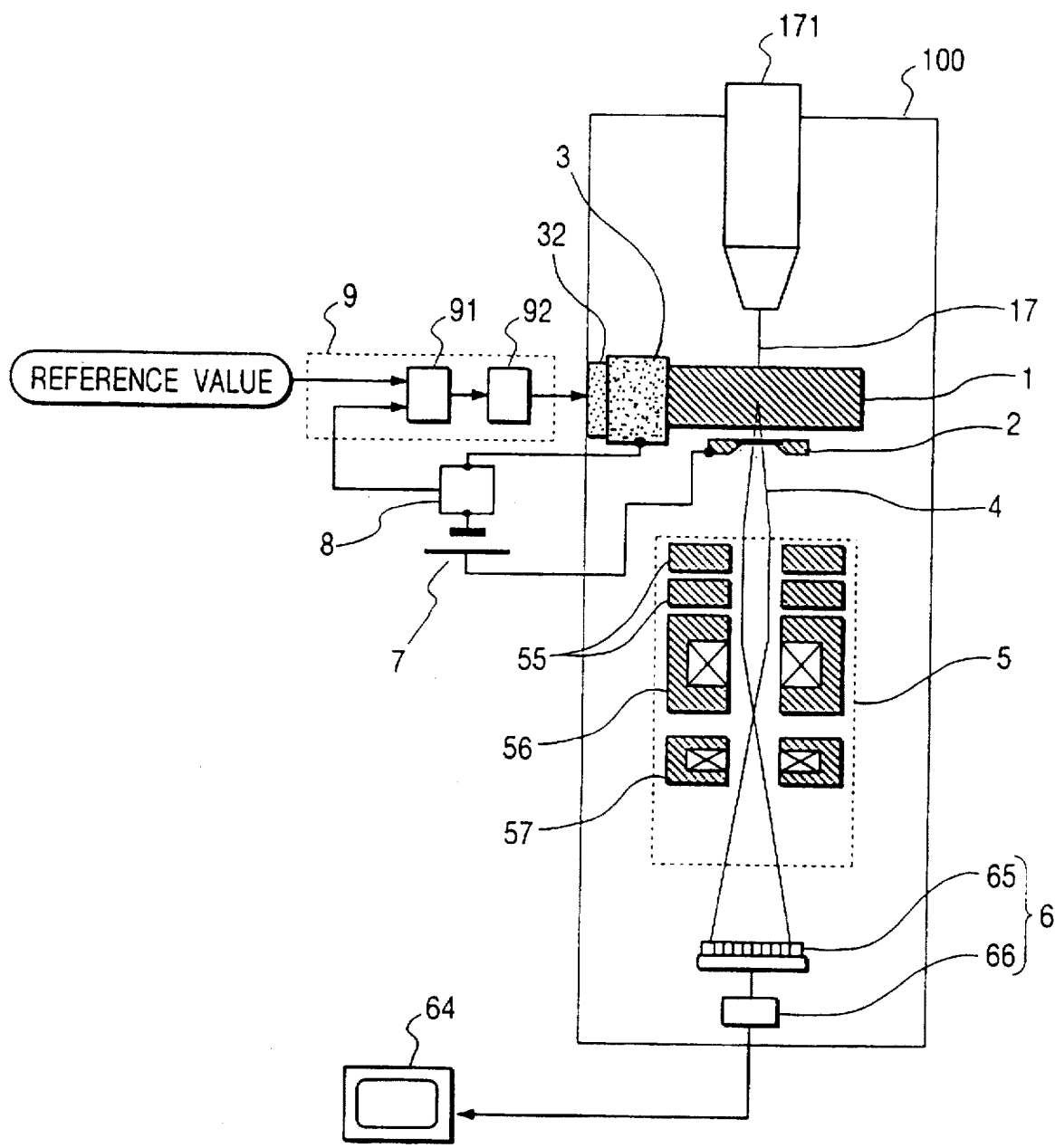
FIG. 13 is a schematic block diagram showing an electron microscope according to an eighth embodiment of the present invention.

To perform observation of the inside of a sample and analysis described in this embodiment, it is desirable that attached equipment for sectioning an area of a sample to be observed minutely to the thickness suitable for observation with the TEM is mounted in a conduction electron microscope according to the present invention as shown in FIG. 13. In the apparatus shown in FIG. 13, a solid sample 1 is sectioned using a focused ion beam (FIB) 17 and therefore, an FIB working device 171 is provided in a vacuum chamber 100. If this device is used, the upper face of a solid sample 1 can be worked (etched) by FIB 17, emitting an electron beam 4 from the lower face of the solid sample 1 and observing the inside of the sample. Therefore, the position inside a solid sample in which an electric defect exists can be securely sectioned.

The constitutions of the apparatuses described in the first and seventh embodiments are combined in the other constitution of the apparatus shown in FIG. 13 and the type of a solid sample 1 is the same as in the first embodiment. A gap driving mechanism 3 which also functions as a holder of a solid sample 1 is fixed in the vacuum chamber 100 via an insulating stand 32, and the gap driving mechanism 3 and the solid sample 1 are in conduction. The negative terminal of a circuit including a voltage supply (gap voltage supply) 7 for applying a potential difference between a solid sample 1 and a thin film electrode 2 is connected to the gap driving mechanism 3. Therefore, as a sample can be observed only by putting the solid sample 1 on the gap driving mechanism 3 without directly connecting the terminal of the potential applying circuit to the solid sample 1, the advantage that samples can be readily replaced can be obtained.

According to this embodiment, as the positional data of an electric defect inside a solid sample can be obtained, a portion including the electric defect inside the sample is precisely sectioned based upon this positional data and the electric defect can be securely analyzed by another arbitrary analysis means.

As described above in the preferred embodiments, according to the present invention, the position and influence of a minute electric defect existing inside a solid sample can be directly measured. That is, as the inside of a solid sample can be readily observed without a complicated sample working process, a solid device including a semiconductor device can be inspected and the electric characteristics of new material for their devices can be swiftly and precisely evaluated.

It is further understood by those skilled in the art that the foregoing description is a preferred embodiment of the disclosed device and that various changes and modifications may be made in the invention without departing from the spirit and scope thereof.

What is claimed is:

1. An electron microscope, comprising:

sample holding means for holding a solid sample having a flat surface;

a film electrode provided opposite said flat surface of said solid sample and separated from said flat surface by a gap;

potential difference applying means for applying a potential difference between said solid sample and said film electrode;

electronic optical means for forming an electronic image by electrons emitted from said flat surface and passing through said film electrode; and electronic image detecting means for detecting the electronic image.

2. An electron microscope according to claim 1, wherein said potential difference applying means applies a potential drop from said solid sample to said film electrode.

3. An electron microscope according to claim 1, wherein:

said film electrode is convex on the side facing said solid sample.

4. An electron microscope according to claim 1, further comprising:

current generating means for generating a current flow inside said solid sample.

5. An electron microscope according to claim 1, further comprising:

a coating layer on a surface of said film electrode that does not face said solid sample, said coating layer reducing the work function of said film electrode.

6. An electron microscope, comprising:

sample holding means for holding a solid sample having a flat surface;

a film electrode provided opposite said flat surface of said solid sample and separated from said surface by a gap;

electric field generating means for forming an electric field between said solid sample and said film electrode;

a gap controlling device for controlling the gap between the flat surface of said solid sample and said film electrode;

moving means for changing the relative positional relationship between said solid sample and said film electrode in a direction parallel to the surface of said solid sample;

electronic optical means for forming an electronic image by electrons emitted from said flat surface and passing through said film electrode; and image detecting means for detecting said electronic image.

7. An electron microscope according to claim 6, wherein:

said electric field generating means includes:

a first terminal to be connected to said film electrode;

a second terminal to be connected to said solid sample; and a power supply provided between said first terminal and said second terminal.

8. An electron microscope according to claim 6, wherein:

said electric field generating means includes a power supply, one end of said power supply being connected to said film electrode and the other end of said power supply being connected to said sample holding means; and said sample holding means holds said solid sample with said device electrically in conduction.

9. An electron microscope, comprising:

a sample holder for holding a solid sample having a flat surface;

an optical system for irradiating said solid sample with a light beam;

a film electrode arranged opposite said flat surface of said solid sample and separated from the surface by a gap;

potential difference applying means for applying a potential difference between said solid sample and said film electrode;

an electronic optical system for forming an electronic image by an electron emitted from said flat surface and passing through said film electrode; and an image detector for detecting said electronic image.

* * * * *